US011568932B2

(12) United States Patent
Lu et al.

(10) Patent No.: US 11,568,932 B2
(45) Date of Patent: Jan. 31, 2023

(54) READ CACHE FOR RESET READ DISTURB MITIGATION

(71) Applicant: Micron Technology, Inc., Boise, ID (US)

(72) Inventors: Zhongyuan Lu, Boise, ID (US); Stephen H. Tang, Fremont, CA (US); Robert J. Gleixner, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 104 days.

(21) Appl. No.: 17/181,346

(22) Filed: Feb. 22, 2021

(65) Prior Publication Data

US 2022/0270679 A1    Aug. 25, 2022

(51) Int. Cl.
  *G06F 12/0877*  (2016.01)
  *G11C 13/00*  (2006.01)
  *G11C 15/00*  (2006.01)
  *G11C 11/16*  (2006.01)

(52) U.S. Cl.
  CPC ........ *G11C 13/004* (2013.01); *G06F 12/0877* (2013.01); *G11C 13/003* (2013.01); *G11C 13/0061* (2013.01); *G11C 13/0069* (2013.01); *G11C 15/00* (2013.01); *G06F 2212/1024* (2013.01); *G11C 11/1673* (2013.01); *G11C 13/0004* (2013.01)

(58) Field of Classification Search
  CPC . G11C 13/004; G11C 13/003; G11C 13/0061; G11C 13/0069; G11C 15/00; G11C 11/1673; G11C 13/0004; G06F 12/0877; G06F 2212/1024

USPC .......................................................... 711/118
See application file for complete search history.

(56) References Cited

U.S. PATENT DOCUMENTS

| | | | |
|---|---|---|---|
| 2005/0010726 A1* | 1/2005 | Rai | G06F 13/1631 711/213 |
| 2005/0246497 A1* | 11/2005 | Mekhiel | G06F 12/0888 711/E12.004 |
| 2014/0195764 A1* | 7/2014 | Shen | G06F 3/0673 365/230.02 |
| 2015/0046651 A1* | 2/2015 | Luttrell | G06F 12/0811 711/122 |
| 2017/0177483 A1* | 6/2017 | Vinod | G06F 12/0811 |
| 2018/0018264 A1* | 1/2018 | Moyer | G06F 12/0868 |
| 2021/0064541 A1* | 3/2021 | Kothinti Naresh | G06F 12/12 |
| 2021/0342094 A1* | 11/2021 | Liu | G06F 3/0604 |

* cited by examiner

*Primary Examiner* — Ly D Pham
(74) *Attorney, Agent, or Firm* — Fletcher Yoder, P.C.

(57) ABSTRACT

Methods and systems include memory devices with multiple memory cells configured to store data. The memory devices also include a cache configured to store at least a portion of the data to provide access to the at least the portion of the data without accessing the multiple memory cells. The memory devices also include control circuitry configured to receive a read command having a target address. Based on the target address, the control circuitry is configured to determine that the at least the portion of the data is present in the cache. Using the cache, the control circuitry also outputs read data from the cache without accessing the plurality of memory cells.

23 Claims, 6 Drawing Sheets

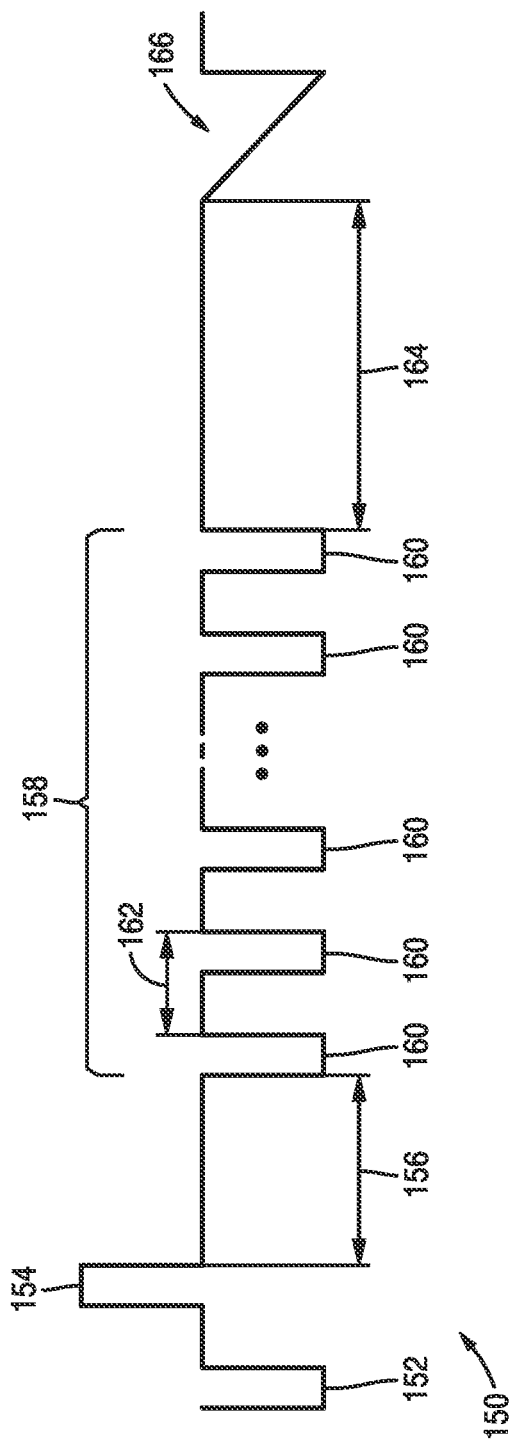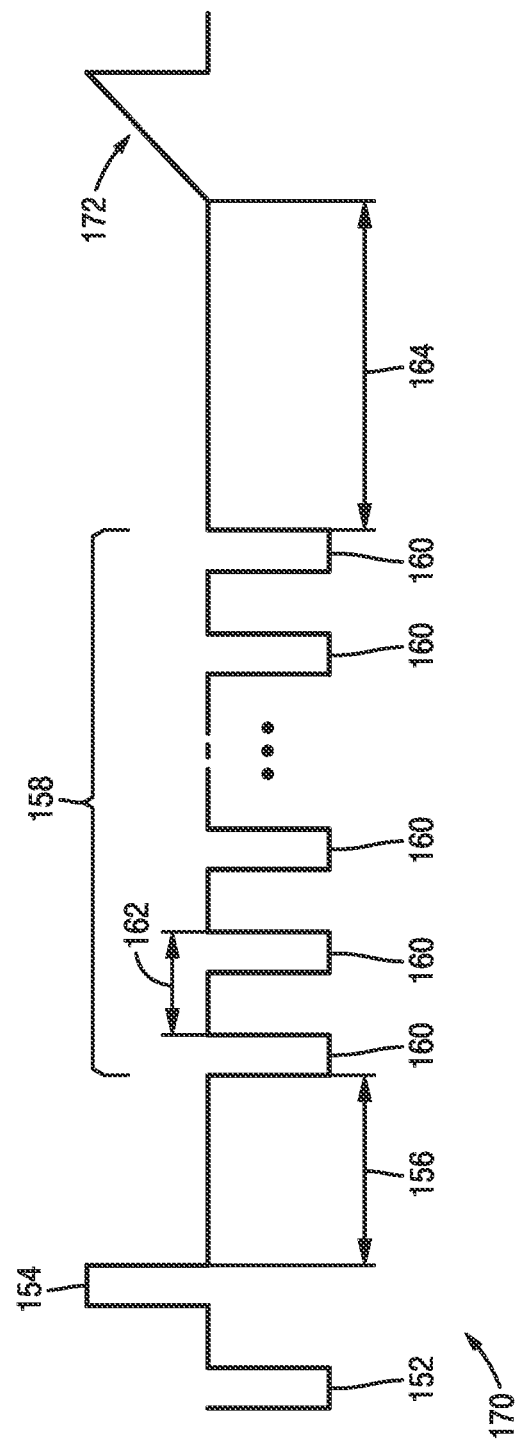

READ CACHE FOR RESET READ DISTURB MITIGATION

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of data from the memory.

Some memory devices include memory cells that may be accessed by turning on a transistor that couples the memory cell (e.g., a capacitor) with a wordline or a bitline. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of a threshold-type memory cell may be a cross-point memory cell.

With threshold-type memories, the threshold voltage (VTH) determines when certain actions are performed. However, this threshold may suffer from reliability issues on read disturb on resets (RDR) destroying a poling effect by soft programming an opposite polarity. Specifically, the reliability issues may result in a cumulative VTH degradation (e.g., decrease in VTH) as numbers of read disturbs increase until memory operations fail. These reliability issues may be larger or more problematic for some aspects of the memory device, such as a read disturb on reset (RDR), than for other aspects (e.g., write operations).

BRIEF DESCRIPTION OF THE DRAWINGS

Various aspects of this disclosure may better be understood upon reading the following detailed description and upon reference to the drawings in which:

FIG. 3 is a timing diagram of a read operation of the memory device of FIG. 1 with a negative final read out, according to an embodiment of the present disclosure;

FIG. 4 is a timing diagram of a read operation of the memory device of FIG. 1 with a positive final read out, according to an embodiment of the present disclosure;

DETAILED DESCRIPTION

Figure 1:
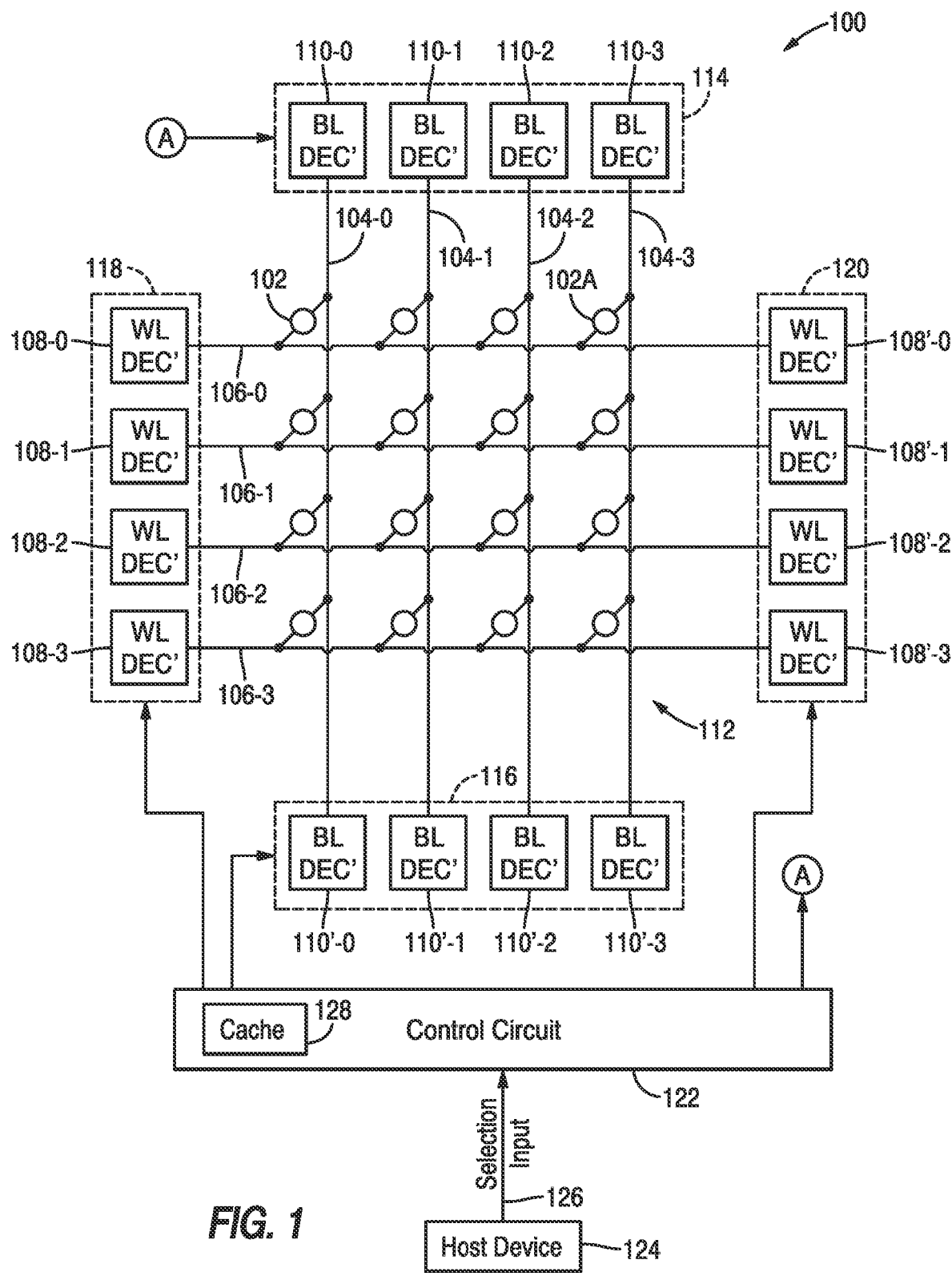
FIG. 1 is a simplified block diagram illustrating certain features of a memory device including a cache and a memory array of memory cells, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells, where each memory cell is coupled between at least two access lines. For example, a memory cell may be coupled to access lines, such as a bitline and a wordline. Each access line may be coupled to a large number of memory cells. To select a memory cell, one or more drivers may provide selection signals (e.g., a voltage and/or a current) on the access lines to access storage capacities of the memory cell. By applying voltages and/or currents to the respective access lines, the memory cell may be accessed, such as to write data to the memory cell and/or read data from the memory cell.

In some memories, memory cells of the array may be organized into decks of memory cells. A deck of memory cells may be a single plane of memory cells disposed between a layer of wordlines and a layer of bitlines. The array may be a stack of decks that includes any number of decks of memory cells (e.g., 0 decks, 1 deck, 2 decks, 4 decks, any number of decks) as different layers of the array.

Within a deck, a two-dimensional array of memory cells may be arranged at different intersections of the wordlines and the bitlines in the plane. As previously noted for threshold-type memories, the threshold voltage (VTH) may suffer from reliability issues on read disturb on resets (RDR) destroying a poling effect by soft programming an opposite polarity. Specifically, the reliability issues may result in a cumulative VTH degradation (e.g., decrease in VTH) as numbers of read disturbs increase until the memory operations repeatedly fail. As discussed below, this VTH degradation may be mitigated by expanding an inter-pulse delay (IPD) between pulses of a read operation. However, this expansion, if unmodified, may prevent compliance with an output transmission of data for the memory devices. To address this issue, a cache may be used in place of read operations to the memory array itself. This time where read operations are made without accessing the memory array may be used to expand the IPD for reads that are performed on the memory array itself thereby mitigating the VTH degradation without sacrificing compliance with a specification for the memory device.

Keeping the foregoing introduction in mind, FIG. 1 is a block diagram of a portion of a memory device 100. The memory device 100 may be any suitable form of memory, such as non-volatile memory (e.g., a cross-point memory) and/or volatile memory. The memory device 100 may include one or more memory cells 102, one or more bitlines 104 (e.g., 104-0, 104-1, 104-2, 104-3), one or more wordlines 106 (e.g., 106-0, 106-1, 106-2, 106-3), one or more wordline decoders 108 (e.g., wordline decoding circuitry), and one or more bitline decoders 110 (e.g., bitline decoding circuitry). The memory cells 102, bitlines 104, wordlines 106, wordline decoders 108, and bitline decoders 110 may form a memory array 112.

Each of the memory cells 102 may include a selector and/or a storage element. When a voltage across a selector of a respective memory cell reaches a threshold, the storage element may be accessed to read a data value from and/or write a data value to the storage element. In some embodiments, each of the memory cells 102 may not include a separate selector and storage element, and have a configuration such that the memory cell nonetheless acts as having a selector and storage element (e.g., may include use of a material that behaves both like a selector material and a storage element material). For ease of discussion, FIG. 1 may be discussed in terms of bitlines 104, wordlines 106, wordline decoders 108, and bitline decoders 110, but these designations are non-limiting. The scope of the present disclosure should be understood to cover memory cells 102 that are coupled to multiple access lines and accessed through respective decoders, where an access line may be used to store data into a memory cell and read data from the memory cell 102. Furthermore, the memory device 100 may include other circuitry, such as a biasing circuitry configured to bias the bitlines 104 or wordlines 106 in a corresponding direction. For example, the bitlines 104 may be biased with positive biasing circuitry while the wordlines 106 may be biased with negative biasing circuitry.

The bitline decoders 110 may be organized in multiple groups of decoders. For example, the memory device 100 may include a first group of bitline decoders 114 (e.g., multiple bitline decoders 110) and/or a second group of bitline decoders 116 (e.g., different group of multiple bitline decoders 110). Similarly, the wordline decoders 108 may also be arranged into groups of wordline decoders 108, such as a first group of wordline decoders 118 and/or a second group of wordline decoders 120. Decoders may be used in combination with each other to drive the memory cells 102 (e.g., such as in pairs and/or pairs of pairs on either side of the wordlines 106 and/or bitlines 104) when selecting a target memory cell 102A from the memory cells 102. For example, bitline decoder 110-3 may operate in conjunction with bitline decoder 110'-3 and/or with wordline decoders 108-0, 108'-0 to select the memory cell 102A. As may be appreciated herein, decoder circuitry on either ends of the wordlines 106 and/or bitlines 104 may be different.

Each of the bitlines 104 and/or wordlines 106 may be metal traces disposed in the memory array 112, and formed from metal, such as copper, aluminum, silver, tungsten, or the like. Accordingly, the bitlines 104 and the wordlines 106 may have a uniform resistance per length and a uniform parasitic capacitance per length, such that a resulting parasitic load may uniformly increase per length. It is noted that the depicted components of the memory device 100 may include additional circuitry not particularly depicted and/or may be disposed in any suitable arrangement. For example, a subset of the wordline decoders 108 and/or bitline decoders 110 may be disposed on different sides of the memory array 112 and/or on a different physical side of any plane including the circuitries.

The memory device 100 may also include a control circuit 122. The control circuit 122 may communicatively couple to respective wordline decoders 108 and/or bitline decoders 110 to perform memory operations, such as by causing the decoding circuitry (e.g., a subset of the wordline decoders 108 and/or bitline decoders 110) to generate selection signals (e.g., selection voltage and/or selection currents) for selecting a target of the memory cells. In some embodiments, a positive voltage and a negative voltage may be provided on one or more of the bitlines 104 and/or wordlines 106, respectively, to a target of the memory cells 102. In some embodiments, the decoder circuits may provide biased electrical pulses (e.g., voltage and/or current) to the access lines to access the memory cell. The electrical pulse may be a square pulse, or in other embodiments, other shaped pulses may be used. In some embodiments, a voltage provided to the access lines may be a constant voltage.

Activating the decoder circuits may enable the delivery of an electrical pulse to the target of the memory cells 102 such that the control circuit 122 is able to access data storage of the target memory cell, such as to read from or write to the data storage. After a target of the memory cells 102 is accessed, data stored within storage medium of the target memory cell may be read or written. Writing to the target memory cell may include changing the data value stored by the target memory cell. As previously discussed, the data value stored by a memory cell may be based on a threshold voltage of the memory cell. In some embodiments, a memory cell may be "set" to have a first threshold voltage or may be "reset" to have a second threshold voltage. A set memory cell may have a lower threshold voltage than a reset memory cell. By setting or resetting a memory cell, different data values may be stored by the memory cell. Reading a target of the memory cells 102 may include determining whether the target memory cell was characterized by the first threshold voltage and/or by the second threshold voltage. In this way, a threshold voltage window may be analyzed to determine a value stored by the target of the memory cells 102. The threshold voltage window may be created by applying programming pulses with opposite polarity biasing to the memory cells 102 (e.g., in particular, writing to selector device (SD) material of the memory cell) and reading the memory cells 102 (e.g., in particular, reading a voltage stored by the SD material of the memory cell 102) using a signal with a given (e.g., known) fixed polarity. In some embodiments, a selection input 126 may be received from a host device 124, such as a host processor reading data from/writing data to the memory device 100 to cause the control circuit 122 to access particular memory cells 102 using respective selection signals to respective wordline decoders 108 and bitline decoders 110. In addition, the control circuit 122 may include a cache 128 which may be used to reduce threshold degradation in accordance with embodiments described in greater detail below.

Figure 2:
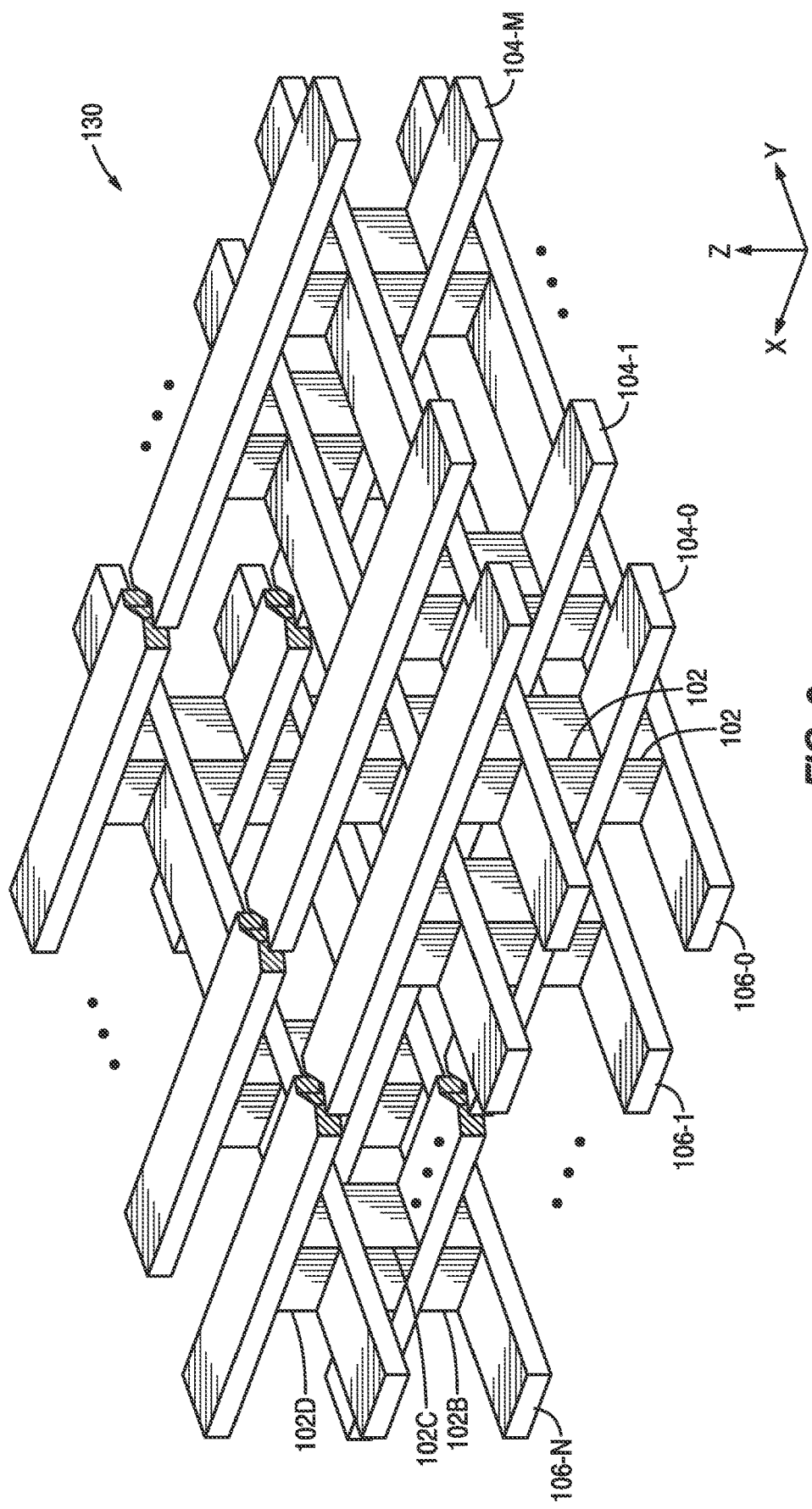
FIG. 2 is a side-view of a diagram illustrating the portion of the memory array of FIG. 1, according to an embodiment of the present disclosure.

FIG. 2 is a diagram illustrating a portion of a memory array 130 in accordance with an embodiment of the present disclosure. Inside the memory array 130, the memory cells are located at intersections of orthogonal lines. The memory array 130 may be a cross-point array including wordlines 106 (e.g., 106-0, 106-1, . . . , 106-N) and bitlines 104 (e.g., 104-0, 104-1, . . . , 104-M). A memory cell 102 may be located at each of the intersections of the wordlines 106 and bitlines 104. The memory cells 102 may function in a two-terminal architecture (e.g., with a particular wordline 106 and the bitline 104 combination serving as the electrodes for the memory cell 102).

Each of the memory cells 102 may be resistance variable memory cells, such as resistive random-access memory (RRAM) cells, conductive-bridging random access memory (CBRAM) cells, phase-change memory (PCM) cells, and/or spin-transfer torque magnetic random-access memory (STT-RAM) cells, among other types of memory cells. Each of the memory cells 102 may include a memory element (e.g., memory material) and a selector element (e.g., a selector device (SD) material) and/or a material layer that functionally replaces a separate memory element layer and selector element layer. The selector element (e.g., SD material) may be disposed between a wordline contact (e.g., a layer interface between a respective one of the wordlines 106 and the memory material) and a bitline contact (e.g., a layer interface between a respective one of the bitlines 104 and the selector element) associated with a wordline or bitline forming the memory cell. Electrical signals may transmit between the wordline contact and the bitline contact when reading or writing operations are performed to the memory cell.

The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cell 102 may include a memory portion of the memory cell 102 (e.g., the portion programmable to different states). For instance, in resistance variable memory cells 102, a memory element can include the portion of the memory cell having a resistance that is programmable to particular levels corresponding to particular states responsive to applied programming voltage and/or current pulses. In some embodiments, the memory cells 102 may be characterized as threshold-type memory cells that are selected (e.g., activated) based on a voltage and/or current crossing a threshold associated with the selector element and/or the memory element. Embodiments are not limited to a particular resistance variable material or materials associated with the memory elements of the memory cells 102. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 102 may be programmed by applying a voltage (e.g., a write voltage) across the memory cells 102 via selected wordlines 106 and bitlines 104. A sensing (e.g., read) operation may be performed to determine a state of one or more memory cells 102 by sensing current. For example, the current may be sensed on one or more bitlines 104/one or more wordlines 106 corresponding to the respective memory cells 102 in response to a particular voltage applied to the selected of the bitlines 104/wordlines 106 forming the respective memory cells 102.

As illustrated, the memory array 130 may be arranged in a cross-point memory array architecture (e.g., a three-dimensional (3D) cross-point memory array architecture) that extends in any direction (e.g., x-axis, y-axis, z-axis). The multi-deck cross-point memory array 130 may include a number of successive memory cells (e.g., 102B, 102C, 102D) disposed between alternating (e.g., interleaved) decks of wordlines 106 and bitlines 104. The number of decks may be expanded in number or may be reduced in number and should not be limited to the depicted volume or arrangement. Each of the memory cells 102 may be formed between wordlines 106 and bitlines 104 (e.g., between two access lines), such that a respective one of the memory cells 102 may be directly electrically coupled with (e.g., electrically coupled in series) with its respective pair of the bitlines 104 and wordlines 106 and/or formed from electrodes (e.g., contacts) made by a respective portion of metal of a respective pair of bitlines 104 and wordlines 106. For example, the memory array 130 may include a three-dimensional matrix of individually-addressable (e.g., randomly accessible) memory cells 102 that may be accessed for data operations (e.g., sense and write) at a granularity as small as a single storage element and/or multiple storage elements. In some cases, the memory array 130 may include more or fewer bitlines 104, wordlines 106, and/or memory cells 102 than shown in the examples of FIG. 2. Each deck may include one or more memory cells 102 aligned in a same plane.

As previously noted, read disturb on reset (RDR) may degrade a respective threshold. Specifically, the second threshold voltage corresponding to the reset may be particularly susceptible to threshold voltage degradation due to RDRs. As previously noted, this degradation may be at least partially due to a destruction of a poling effect by the RDR. Moreover, the amount of degradation may be proportional to the magnitude of the poling effect destructed. Furthermore, the first threshold voltage corresponding to the set may be less susceptible or even immune to such degradations when read disturbs occur on set but may receive some benefit from threshold voltage degradation mitigation. In RDRs, the memory device 100 may have a minimum read-to-read allowance (e.g., 80 ns or 150 ns) for the memory array 130 that may limit a number of RDR counts (e.g., 130 k or 1 M) before the cells repeatedly fail. As discussed below, this threshold degradation may be strongly dependent upon a read cycling inter-pulse delay (IPD) since the length of the IPD may be proportional to the magnitude of the poling effect destructed by the RDR.

Returning to FIG. 1 and as discussed below, a cache 128 may be used to reduce the threshold degradation by expanding the minimum read-to-read delay (i.e., enabling larger IPDs) to mitigate threshold degradation without causing the memory device 100 to operate outside of specification timing for the memory device 100. The cache 128 may be implemented using any suitable storage, such as a first-in, first-out memory (FIFO). Moreover, the cache 128 (e.g., FIFO) may be implemented using a content-addressable medium (CAM) or other suitable implementation. For instance, the CAM may be implemented using a static randomly accessible medium (SRAM). The CAM may use a CAM address as a counter that is incremented when a read misses the cache 128 due to no address in the cache 128 matching an incoming address for the read.

FIG. 3 is a timing diagram 150 of a RDR with a negative polarity final read out. As illustrated, the timing diagram 150 shows a pre-set pulse/value 152 corresponding to a value prior to a reset pulse 154 used to initiate the reset (e.g., power-on reset (POR)) read. After a pre-read delay 156, a reset read 158 begins and has two or more pulses 160. In the reset read 158, IPDs 162 occur between each of the two or more pulses 160 of the read. After a post-read delay 164, a final read out 166 is transmitted. In the illustrated embodiment of the timing diagram 150, the RDR has a negative polarity. A positive polarity RDR may be similarly constructed. For example, FIG. 4 illustrates a timing diagram 170 of an RDR with a positive polarity. In the timing diagram 170, the RDR is exactly the same as the RDR in the timing diagram 150 except that the RDR of FIG. 4 has a final read out 172 with a positive polarity while the final read out 166 of FIG. 3 has a negative polarity.

Figure 5:
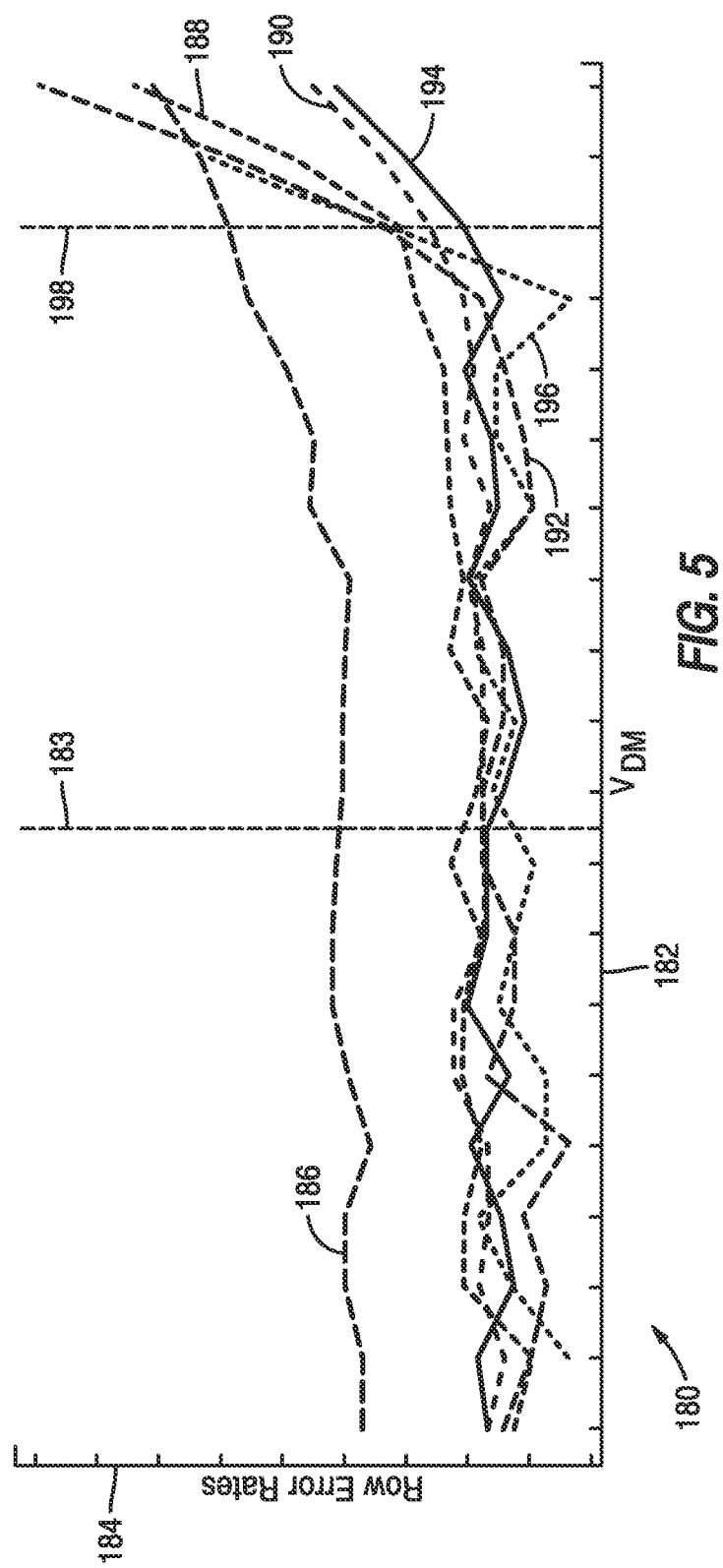
FIG. 5 is a graph of voltages versus row error rates for different numbers of reads using the timing diagram of FIG. 3, according to an embodiment of the present disclosure.

FIG. 5 is a graph 180 that compares possible demarcation voltages 182 (including a stress voltage level 183) to row error rates 184 of different RDR counts, each corresponding to lines 186, 188, 190, 192, 196, and 198 for a negative polarity RDR. For instance, each line may correspond to a different number of reads in rapid succession. For instance, the line 186 may correspond to 130 k reads, the line 188 may correspond to 40 k reads, the line 190 may correspond to 10 k reads, the line 192 may correspond to 1 k reads, the line 194 may correspond to 100 reads, and the line 196 may correspond to 2 reads. Generally, with positive or negative polarity RDRs, an increase in RDRs correlates to higher error rates between the stress voltage level 183 and some demarcation voltage level 198.

Figure 6:
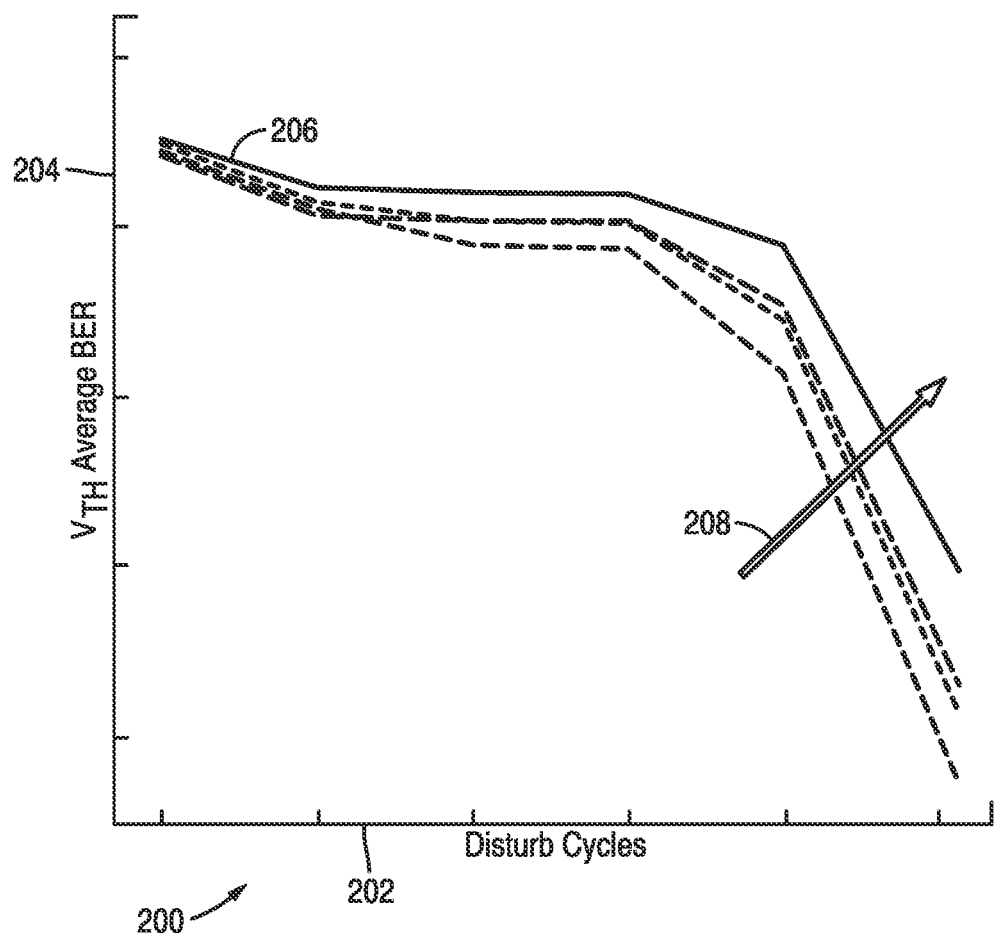
FIG. 6 is a graph of disturb cycles versus bit error rates for different inter-pulse delays for read operations, according to an embodiment of the present disclosure.

FIG. 6 is a graph 200 of a number of disturb cycles 202 compared to a threshold voltage bit error rate 204 with lines 206 corresponding to different IPD durations for a negative polarity RDR. The lines 206 correspond to increasing IPD durations along line 208. As illustrated, with a longer IPD, the degradation at RDR counts is at least partially mitigated. Similar mitigation may be obtained for RDRs with positive polarity final read outs using longer IPD durations. Furthermore, similar mitigation may be achieved irrespective of lengths of the pre-read delay 156 and/or the post-read delay 164. Indeed, some embodiments of the memory device 100 may utilize an expanded and/or shortened pre-read delay 156 and/or the post-read delay 164 while mitigating threshold degradations due to RDRs while others do not expand or shorten the pre-read delay 156 and/or the post-read delay 164. For instance, in some embodiments, the memory device 100 may expand or shorten the pre-read delay 156 and/or the post-read delay 164 to align the reset read 158 and/or the final read out 166, 172 to corresponding locations in the RDR. Although the expanded IPD duration may mitigate threshold voltage degradation, the timing specification for the memory device 100 may not permit reads from the memory array 130 for at least some scenarios. In such scenarios, the memory device 100 may utilize the cache 128 to expand the duration of the IPD longer than is possible without using the cache 128 or operating outside of a specification for the memory device 100. For instance, some reads may be made using cache 128 without disturbing the live array (e.g., the memory array 130). This time freed up in the live array using read operations from the cache 128 may be used to expand the IPD duration to mitigate threshold voltage degradations for at least some operations (e.g., RDRs) that would not be possible inside of a memory device specification without the cache 128.

Figure 7:
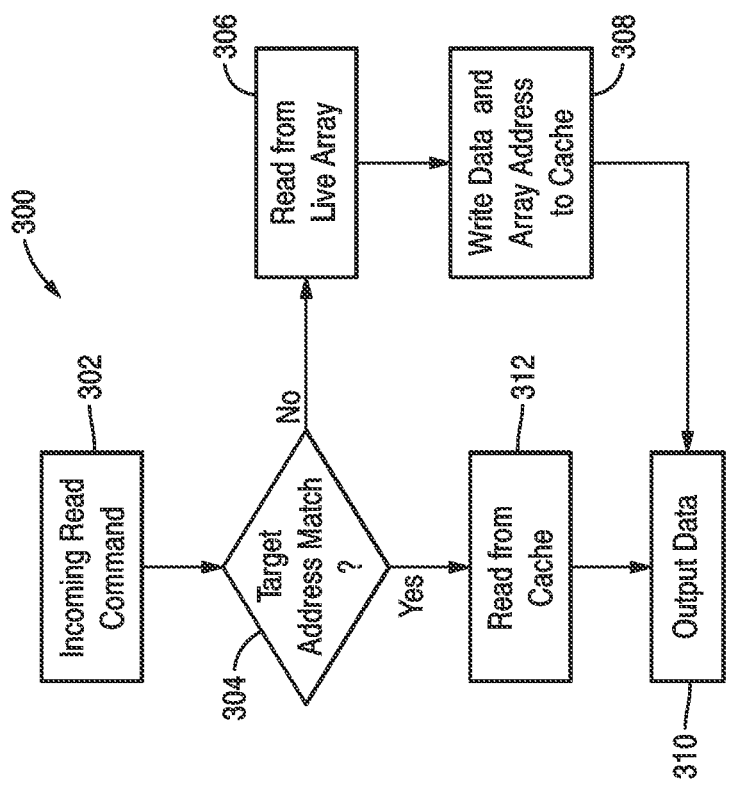
FIG. 7 is a block diagram of a process for a read operation that includes determining whether to read from the cache or the memory array of FIG. 1 in response to a read command, according to an embodiment of the present disclosure.

FIG. 7 is a flow diagram of a process 300 for the control circuit 122 utilizing the cache 128 in mitigating threshold voltage degradation due to RDRs and/or other read operations on the memory cells of the memory device 100. The control circuit 122 receives an incoming read command (block 302). The read command has a corresponding read target address. The read command may be received from the host device 124. The control circuit 122 checks whether the target address matches any entries in the cache 128 (block 304). As previously noted, the cache 128 may be implemented using a FIFO. In some embodiments, a FIFO may be included for each memory partition. For each partition, each entry may have one or more validity bits that indicate whether the entry is valid or invalid. Each entry may also include a number (e.g., 24) of bits corresponding to an address within the partition. The entries may also include a number (e.g., 128) of bits of data stored at the corresponding address. If the cache 128 includes 32 entries that allows 32 reads spaced apart by 80 ns for 4,896 cells. Using the cache 128, the IPD may be relaxed to 80 ns*32=2.56 ns. Other spacings and/or numbers of entries per partition may be used in some embodiments. Furthermore, by having 2^n (e.g., 32) reads, the counter may be wrapped around to overflow past the highest number (e.g., 31) back to zero to continue the FIFO behavior. Also, as previously discussed, the FIFO may be implemented as an SRAM-based CAM with CAM addresses as the counter that wraps around upon overflow. Using the CAM addresses as the counter enables the control circuit 122 to quickly tell if the target address is in the cache 128.

If no match of the target address is found in the cache 128, the control circuit 122 reads the targeted data from the live array (block 306). Upon this read miss, the control circuit 122 then writes the data and corresponding address to the cache 128 for use in subsequent read commands (block 308). The counter is then incremented to the next entry. The data is output from the cache 128 and/or the live array (block 310).

If the target address matches an entry in the cache 128, the control circuit 122 reads from the cache 128 without disrupting the live array (block 312). With at least some of the reads performed using the cache 128, the output of the data may be sufficient to meet timing specifications while relaxing IPDs for RDRs (or other read disturb events) on the live array to mitigate threshold voltage degradation resulting from the RDRs (and/or other read disturb events).

Figure 8:
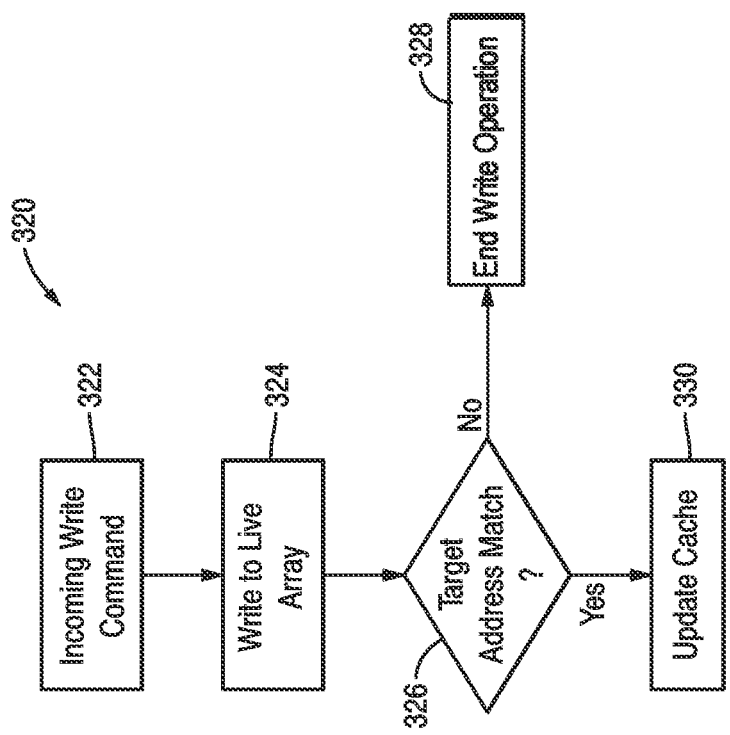
FIG. 8 is a block diagram of a process for a write operation that includes determining whether to write to the cache of FIG. 1 in addition to writing to the memory array of FIG. 1 in response to a write command, according to an embodiment of the present disclosure.

Since the data in the live array may change when a write occurs, the control circuit 122 may update the cache 128 when performing write operations. FIG. 8 is a flow diagram of a process 320. The process 320 includes the control circuit 122 receiving a write command from the host device 124 (block 322). The write command has a target address. The control circuit 122 causes the data of the write command to be written to the live array at the target address (block 324). The control circuit 122 also checks whether the target address matches one or more entries in the cache 128 (block 326). If no entries match the target address, the control circuit 122 deems the write operation ended (block 328). However, if one or more entries match the target address, the control circuit 122 updates the cache 128 (block 330). Updating the cache may be accomplished in a variety of techniques. For example, the control circuit 122 may invalidate the entry in the cache 128 corresponding to the write command. The control circuit 122 may then wait for a next read command to the live array to the target address to re-enable the entry again. Additionally or alternatively, the control circuit 122 may update the entry with the information used to write to the target address in the live array. Additionally or alternatively, the control circuit 122 may invalidate the entire cache 128 and rebuild the cache 128 using subsequent read operations.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
   a plurality of memory cells configured to store data;
   a cache configured to store at least a portion of the data to provide read access to the at least a portion of the data without accessing the plurality of memory cells; and
   control circuitry configured to:
      receive a read command having a target address;
      determine that the at least a portion of the data stored in the cache corresponds to the target address; and
      outputting read data from the cache without accessing the plurality of memory cells, wherein an entry in the cache corresponding to the target address comprises:
         one or more validity bits indicating whether the entry is valid;
         a plurality of data bits indicating data stored at the target address; and
         a plurality of address bits indicating the target address.

2. The memory device of claim 1, wherein the control circuitry is configured to receive the read command from a host device coupled to the memory device and to output the read data to the host device.

3. The memory device of claim 1, wherein the cache comprises a first-in, first-out memory (FIFO).

4. The memory device of claim 1, wherein the cache comprises a content-addressable memory (CAM).

5. The memory device of claim 4, wherein the control circuitry is configured to use CAM addresses of the CAM as a counter that is incremented when read misses occurs for the cache on received read commands.

6. The memory device of claim 1, wherein the control circuitry is configured to lengthen an inter-pulse delay of a read of the plurality of memory cells outside of a specification for data output from the memory device.

7. The memory device of claim 1, wherein the control circuitry is configured to:
   receive another read command having another target address;
   determine that the other target address does not correspond to an entry in the cache; and
   in response to the determination that the other target address does not correspond to the entry, writing data to the cache for the other target address.

8. The memory device of claim 1, wherein the control circuitry is configured to:
   receive a write command having a write target address and write data;
   write the write data to at least a portion of the plurality of memory cells;
   determine that an entry in the cache corresponds to the write target address; and
   update the cache based at least in part on the determination that the entry in the cache corresponds to the write target address.

9. The memory device of claim 8, wherein updating the cache comprises:
   invalidating the entry; and
   waiting for a subsequent read command to re-enable the entry.

10. The memory device of claim 8, wherein updating the cache comprises overwriting the entry with the write data.

11. The memory device of claim 8, wherein updating the cache comprises:
    invalidating an entire cache; and
    rebuilding the cache using subsequent read commands.

12. A method, comprising:
    receiving a first read command at control circuitry of a memory device having a first target address indicating a first location within a plurality of memory cells to be read;
    determining whether an on-device cache of the memory device has a first entry corresponding to the first target address;
    in response to the on-device cache having the first entry corresponding to the first target address, outputting data from the on-device cache without disturbing the first location of the plurality of memory cells;
    receiving a second read command at the control circuitry having a second target address indicating a second location within the plurality of memory cells to be read;
    determining that the on-device cache of the memory device does not have a valid entry corresponding to the second target address; and
    in response to the on-device cache not having a valid entry corresponding to the second target address, outputting data from the second location of the plurality of memory cells.

13. The method of claim 12, wherein the first entry comprises:
    one or more validity bits indicating whether the first entry is valid;
    a plurality of data bits indicating data stored at the first target address; and
    a plurality of address bits indicating the first target address.

14. The method of claim 12, comprising using an expanded inter-pulse delay between pulses of reads of the plurality of memory cells using excess time created using read operations performed using the on-device cache.

15. The method of claim 12, comprising:
    receiving a write command having a write target address and write data;
    storing the write data to a third location of the plurality of memory cells corresponding to the write target address;
    determining that a second entry in the on-device cache corresponds to the write target address; and updating the on-device cache based at least in part on the determination that the second entry in the on-device cache corresponds to the write target address.

16. The method of claim 15, wherein updating the on-device cache comprises overwriting the second entry with the write data.

17. The method of claim 15, wherein updating the on-device cache comprises:
    invalidating the second entry; and
    waiting for a subsequent read to re-enable the second entry.

18. A memory device, comprising:
    a plurality of memory cells configured to store data;
    a cache configured to store a portion of the data to provide read access to the portion of the data without accessing the plurality of memory cells; and
    control circuitry configured to:
        receive a read command having a target address;
        based on the target address, determine whether the target address corresponds to the portion of the data using an entry in the cache;
        if the entry indicates that the portion of the data corresponds to the target address, read the portion of the data from the cache without accessing the plurality of memory cells; and
        if the entry indicates that the target address does not correspond to the portion of the data, read the target address from the plurality of memory cells using a length of inter-pulse delays between pulses of the read operation, wherein the length of the inter-pulse delays are based at least in part on read operations from the cache without disturbing the plurality of memory cells.

19. The memory device of claim 18, wherein the control circuitry comprises the cache.

20. The memory device of claim 19, wherein the cache comprises a content-addressable memory (CAM).

21. The memory device of claim 18, wherein the cache comprises a first-in, first-out memory (FIFO).

22. The memory device of claim 18, wherein the control circuitry is configured to:
    receive a write command having a write target address and write data;
    write the write data to a location of the plurality of memory cells corresponding to the write target address;
    determining that a write entry in the cache corresponds to the write target address; and
    updating the cache based at least in part on the determination that the write entry in the cache corresponds to the write target address.

23. The memory device of claim 22, wherein the write entry comprises the entry.

* * * * *